(12) United States Patent
Chen

(10) Patent No.: US 12,155,014 B2
(45) Date of Patent: Nov. 26, 2024

(54) LIGHT-EMITTING APPARATUS FOR AUTOMOBILE SUNROOF

(71) Applicant: SHINING VICTORY INTERNATIONAL HOLDINGS CO., LIMITED TAIWAN BRANCH, Tainan (TW)

(72) Inventor: Keng-Sheng Chen, New Taipei (TW)

(73) Assignee: SHINING VICTORY INTERNATIONAL HOLDINGS CO., LIMITED, Kowloon (HK)

( * ) Notice: Subject to any disclaimer, the term of this patent is extended or adjusted under 35 U.S.C. 154(b) by 159 days.

(21) Appl. No.: 18/177,612

(22) Filed: Mar. 2, 2023

(65) Prior Publication Data

US 2024/0297273 A1  Sep. 5, 2024

(51) Int. Cl.
*H01L 33/50* (2010.01)
*B60Q 3/208* (2017.01)
*B60Q 3/64* (2017.01)
*B60Q 3/68* (2017.01)
*B60Q 3/80* (2017.01)
*F21V 8/00* (2006.01)
*F21Y 113/10* (2016.01)
(Continued)

(52) U.S. Cl.
CPC .............. *H01L 33/50* (2013.01); *B60Q 3/208* (2017.02); *B60Q 3/64* (2017.02); *B60Q 3/68* (2017.02); *B60Q 3/80* (2017.02); *G02B 6/0068* (2013.01); *G02B 6/0073* (2013.01); *H01L 33/44* (2013.01); *F21Y 2113/10* (2016.08); *F21Y 2115/10* (2016.08); *H01L 2933/0025* (2013.01)

(58) Field of Classification Search
CPC .. B60Q 3/208; B60Q 3/64; B60Q 3/68; F21V 8/00; H01L 33/50; F21Y 113/10; F21Y 115/10
See application file for complete search history.

(56) References Cited

U.S. PATENT DOCUMENTS 9,310,041 B2 * 4/2016 Pfeil ........................ B60Q 3/64
10,099,606 B2 * 10/2018 Salter ..................... H05B 45/12
(Continued)

FOREIGN PATENT DOCUMENTS

CN   103770696 B   10/2016
CN   107471978 A   12/2017
CN   109624837 B    7/2020

*Primary Examiner* — William J Carter
(74) *Attorney, Agent, or Firm* — RABIN & BERDO, P.C.

(57) ABSTRACT

A light-emitting apparatus for automobile sunroof is provided, comprising: a light-adjusting layer, an adhesive layer, a light-guiding layer, a light-emitting module, and a controller; wherein, the light-adjusting layer is controlled to be transparent or opaque by power-on or power-off; the adhesive layer is on first surface of the light-adjusting layer and used to stick to the sunroof; the light-guiding layer is arranged on the second surface of the light-adjusting layer, and is provided with a pattern layer; the light-emitting module is arranged on at least one side of the light-guiding layer; the controller controls the transparency of the light-adjusting layer; wherein, when the light-adjusting layer is transparent, the light-emitting module is not powered and does not emit light; when the light-adjusting layer is opaque, the light-emitting module is energized to emit light, so that light enters the light-guiding layer to generate an illuminous pattern.

8 Claims, 6 Drawing Sheets

(51) Int. Cl.
    *F21Y 115/10*     (2016.01)
    *H01L 33/44*     (2010.01)

(56) References Cited

U.S. PATENT DOCUMENTS

| | | | |
|---|---|---|---|
| 11,084,419 B1 * | 8/2021 | Chen | B60Q 3/68 |
| 11,644,609 B2 * | 5/2023 | Botu | B32B 17/10541 |
| | | | 362/611 |

* cited by examiner

LIGHT-EMITTING APPARATUS FOR AUTOMOBILE SUNROOF

BACKGROUND OF THE INVENTION

1. Field of the Invention

The present invention relates generally to a light-emitting apparatus installed on the surface of an automobile sunroof glass to create an atmosphere, and more particularly, to a light-emitting apparatus for an automobile sunroof capable of controlling whether to see through the sunroof glass.

2. The Prior Arts

The sunroof is commonly configured in cars. In addition to opening the sunroof to obtain good ventilation effect inside the car and for the occupant to enjoy the air in the suburbs, people also hope to appreciate the night sky view outside when the sunroof is closed, but the functions of the conventional sunroof function end here. Therefore, to create an atmosphere in the car to enhance the driving experience, the application of ambient light technology to automobile sunroofs has been widely used in mid-to-high-end vehicles.

For example, Chinese Patent CN107471978A discloses a luminous vehicle window glass; Chinese Patent CN109624837B discloses a sunroof glass for adjusting the atmosphere in a vehicle; Chinese Patent CN103770696B discloses a vehicle assembly glass.

The common feature of the aforementioned several published patent documents is that only the glass has a luminous effect, or it can only produce a single reflective pattern without changing the illumination effect. Therefore, U.S. Pat. No. 11,084,419 disclosed a light-emitting apparatus for automobile sunroof, able to change the illumination pattern when installed on the automobile sunroof to create a richer and more comfortable ambient inside the automobile.

However, there is no structure provided in disclosed patents to control whether the sunroof can be seen through.

SUMMARY OF THE INVENTION

A primary objective of the present invention is to provide a light-emitting apparatus suitable for installation on the sunroof glass of an automobile. The light-emitting apparatus can control whether the sunroof can be seen through, and change the displayed light-emitting pattern to create a more varied and comfortable atmosphere inside the automobile when the sunroof becomes non-transparent.

The light-emitting apparatus for automobile sunroof provided by the present invention includes: a light-adjusting layer, formed into a transparent state when energized, and formed into an opaque state when not energized; an adhesive layer, disposed on a first surface of the light-adjusting layer, for bonding to the surface of the automobile sunroof; a light-guiding layer, disposed on a second surface of the light-adjusting layer, at least one surface of the light-guiding layer being disposed with a patterned layer; a light-emitting module, disposed on at least one side of the light-guiding layer to emit light into the light-guiding layer for conduction to produce a luminous effect of the patterned layer; and a controller, electrically connecting the light-adjusting layer and the light-emitting module; wherein, when the controller controlling a current to flow into the light-adjusting layer to form transparency, the light-emitting module being inactive and not emitting light; when the controller allowing the current to flow into the light-adjusting layer to form opacity, the light-emitting module becoming energized to emit light.

In a preferred embodiment of the present invention, the light-guiding layer is disposed on the light adjusting layer by gluing.

In a preferred embodiment of the present invention, the light-guiding layer is printed on the second surface of the light-adjusting layer with a material having light-guiding properties, and the pattern is formed on the surface of the light-guiding layer.

In a preferred embodiment of the present invention, a coating with a first pattern is provided on the first surface of the light-guiding layer, and the first pattern is formed by a first ink that can produce a fluorescent reaction to ultraviolet light; a third pattern is formed on the second surface of the light-guiding layer opposite to the first surface, and the third pattern comprises a plurality of recesses that can reflect and refract light; wherein the light-emitting module comprises a printed circuit board, a plurality of first light-emitting elements, and a plurality of third light-emitting elements arranged on the printed circuit board; the plurality of first light-emitting elements emits ultraviolet light, and the plurality of third light-emitting elements emits primary color light.

In a preferred embodiment of the present invention, the first light-emitting element is an ultraviolet LED, and the third light-emitting element is a primary color LED.

In a preferred embodiment of the present invention, the coating further includes a second pattern, the second pattern is formed by a second ink that can produce a fluorescent reaction to infrared light and does not overlap with the first pattern, a plurality of second light-emitting elements are arranged on the printed circuit board, and the plurality of second light-emitting elements emits infrared light.

In a preferred embodiment of the present invention, the second light-emitting element is an infrared LED.

In a preferred embodiment of the present invention, the third pattern is formed by laser engraving to form the plurality of recesses on the second surface of the light-guiding layer.

When the light-emitting apparatus for automobile sunroof of the present invention is installed on the glass of the automobile sunroof, the occupant can watch the external view through the sunroof through the controller to become in a transparent state without opening the sunroof. When finishing viewing, the sunroof can be controlled to become opaque through the controller. In addition, different light-emitting elements can be switched to display fluorescent or reflective patterns in a variety of illuminations, so as to create a richer and more comfortable atmosphere inside the car.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
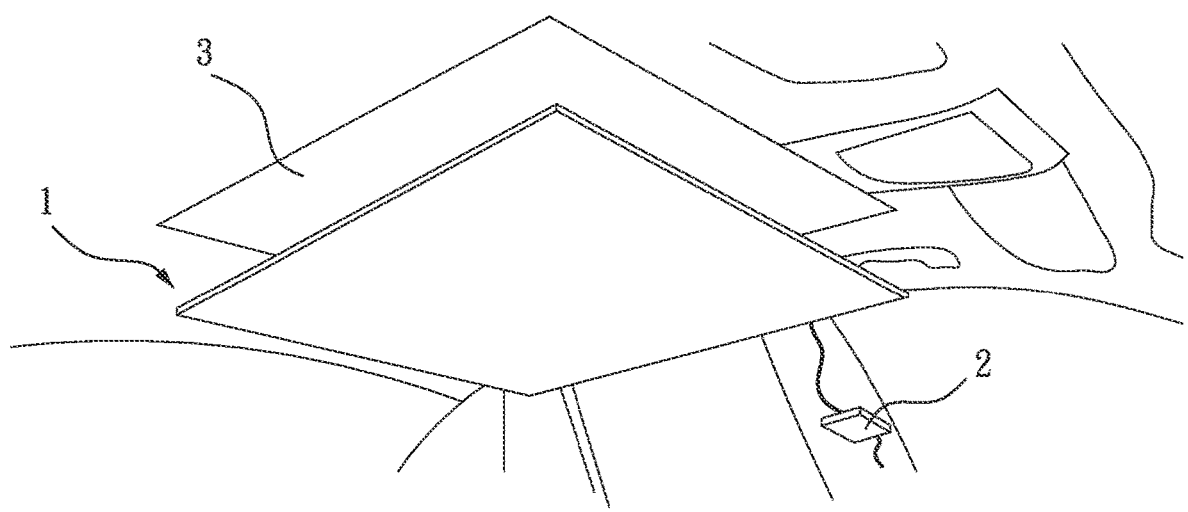
FIG. 1 is a schematic view showing the state of the light-emitting apparatus of the present invention installed on the sunroof glass of an automobile.
Figure 2:
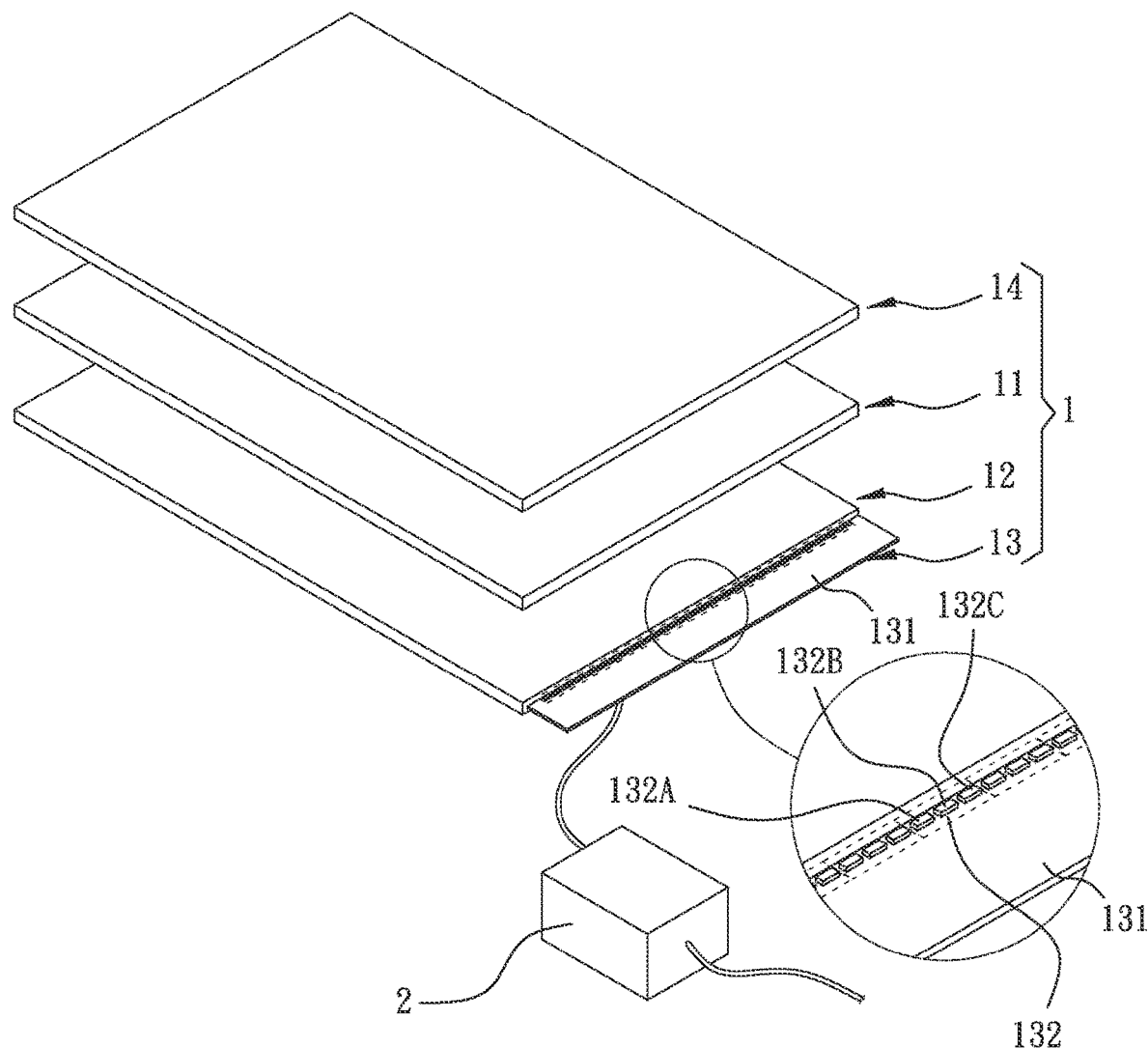
FIG. 2 is a schematic perspective view showing the structure of the light-emitting apparatus of the present invention.
Figure 3:
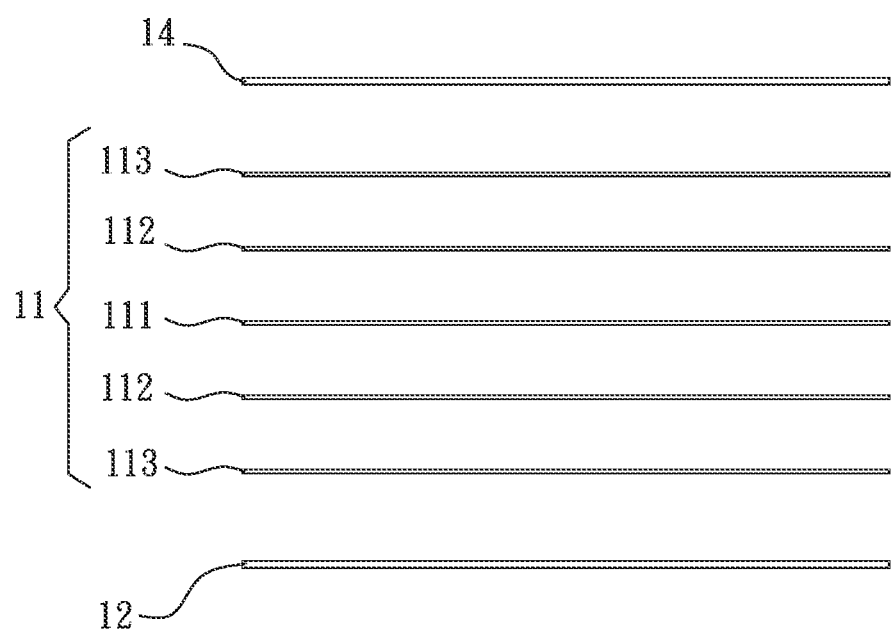
FIG. 3 is a schematic planar exploded view showing the structure of the light-emitting apparatus of the present invention.

FIG. 1 is a schematic view showing the state of the light-emitting apparatus of the present invention installed on the sunroof glass of an automobile; FIG. 2 is a schematic perspective view showing the structure of the light-emitting apparatus of the present invention; FIG. 3 is a schematic planar exploded view showing the structure of the light-emitting apparatus of the present invention.

As shown in FIGS. 1-3, the light-emitting apparatus 1 for automobile sunroofs provided by the present invention is mainly used for light-emitting apparatus installed on automobile sunroof glass 3, and includes: a light-adjusting layer 11, a light-guiding layer 12, a light-emitting module 13, an adhesive layer 14, and a controller 2. Wherein, the light-adjusting layer 11 is also called Polymer Dispersed Liquid Crystal (PDLC). The light-adjusting layer 11 is a film that can adjust the light passing state, and mainly operates between the dispersing state and the transparent state, that is, the film itself can switch between the light-transmitting (transparent) and light-impenetrable (non-transparent) states, whose transparency is adjusted by the voltage. Known light-adjusting films are widely used in modern architectural glass curtain walls, window glass, interior compartments of buildings, side windows of various vehicles and aircrafts, etc. Through the adjustment of incident light and the blocking of heat energy to realize the control of heat entering and exiting through windows, the light-adjusting films provide a solution that automatically changes color as needed for sun shading or heat insulation.

Specifically, as shown in FIG. 3, the light-adjusting layer 11 of the present invention includes a liquid crystal layer 111, two indium tin oxide (ITO) conductive layers 112 that are bonded to the opposite sides of the liquid crystal layer 111, and a PET base film layer 113 bonded on outer surface of each ITO conductive layer 112 on opposite sides. The liquid crystal layer 111 is a high-tech photoelectric film formed by encapsulating the liquid crystal film through high temperature and high pressure. The user can control the arrangement of liquid crystal molecules through whether or not the power is on, so as to achieve the purpose of controlling the transparent or opaque state of the film. More specifically, the application principle of the liquid crystal layer 111 is: the liquid crystal molecules are arranged in a straight line when the power is on, and the liquid crystal film is transparent; when the power is off, the liquid crystal molecules are in a scattering state, and the liquid crystal film is light-penetrable but opaque.

In one of the embodiments of the present invention, the light-guiding layer 12 can be made of a transparent material with good light-guiding properties and appropriate thickness to make a plate, preferably a soft transparent material that can guide light so that it can be cut, assembled, and attached to the sunroof glass according to the size and curvature of the sunroof.

Figure 4:
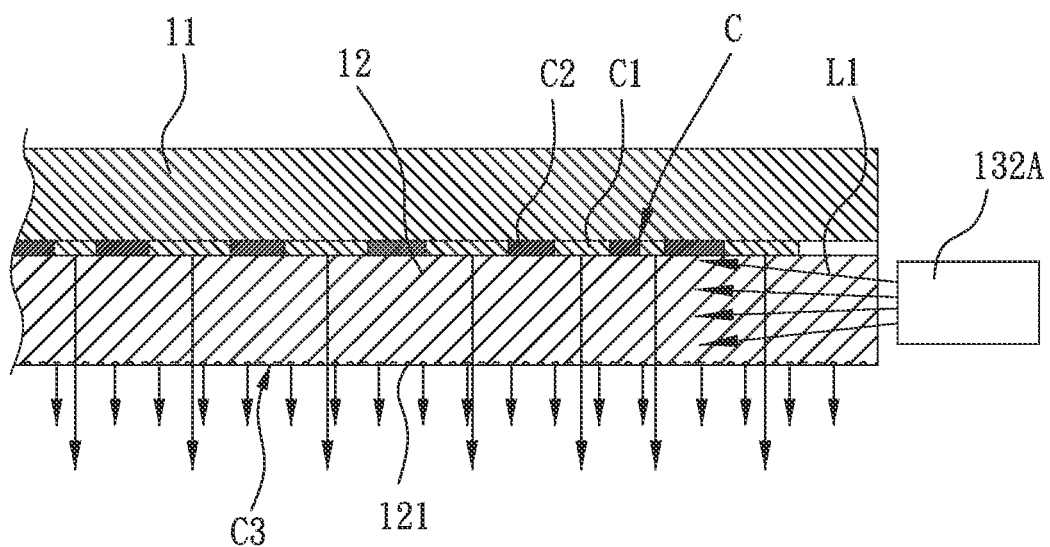
FIG. 4 is a schematic side view showing the first light-emitting element of the light-emitting apparatus of the present invention emitting ultraviolet light so that the first pattern of the coating produces a fluorescent reaction.

The two opposite planes of the light-guiding layer 12 are respectively the first surface and the second surface. In the present invention, the first ink and the second ink can be preferably embossed or printed on the light-guiding layer 12. The first surface of the light-guiding layer 12 forms a first pattern C1 and a second pattern C2 that do not overlap each other, and the first pattern C1 and the second pattern C2 together constitute the coating C on the first surface of the light-guiding layer 12 (as shown in FIG. 4).

The basic composition of the first ink and the second ink includes: pigments, linkers and additives, which are all inorganic compounds or organic compounds, and are made into printing inks with different characteristics through proper adjustment of the proportion of the ingredients. For example, adding appropriate fluorescent pigment powder to the ink can make the printed pattern produce fluorescent reaction. The present invention uses colorless fluorescent pigments as one of the ingredients of the first ink and the second ink respectively, and adds different additives to the first ink and the second ink to make the first pattern C1 printed by the first ink produce a fluorescent reaction and emits light when exposed to ultraviolet light, but does not produce a fluorescent reaction and can hardly be seen visually when exposed to other light. In other words, the first ink can be regarded as an invisible ink. The second pattern C2 printed by the second ink produces a fluorescent reaction and emits light when exposed to the invisible infrared light, but does not produce a fluorescent reaction is almost impossible to be seen visually when exposed to other light, that is, the second ink is also an invisible ink. The first pattern C1 can be any pattern; the second pattern C2 can be any pattern different from the first pattern C1, even a pattern complementary to the first pattern C1, but the first pattern C1 and the second pattern C2 do not overlap each other.

The second surface of the light-guiding layer 12 may use laser engraving technology to form a plurality of small recesses 121, and the third pattern C3 is formed by the plurality of recesses 121. Through the structure of the plurality of small recesses 121, the light transmitted in the light-guiding layer 12 will be reflected and refracted when reaching the recesses 121, so that the light is brighter at the recesses 121 than at the other areas to display the third pattern C3.

In another embodiment, the present invention can also only set the first pattern C1 or only the second pattern C2 on the coating C on the first surface of the light-guiding layer 12, instead of setting both the first pattern and the second pattern C2 (not shown in the figure).

As shown in FIG. 2, the light-emitting module 13 preferably includes a printed circuit board 131, a plurality of first light-emitting elements 132A, a plurality of second light-emitting elements 132B, and a plurality of third light-emitting element 132C, all disposed on the printed circuit board 131. The plurality of first light-emitting elements 132A preferably use ultraviolet light-emitting diodes (UV LEDs) for emitting ultraviolet light; the second light-emitting element 132B preferably uses infrared light-emitting diodes for emitting infrared light; and the plurality of third light-emitting elements 132C preferably use primary color light-emitting diodes (RGB LEDs) to emit three primary colors of red, green, and blue light.

More specifically, when the first surface of the light-guiding layer 12 is provided with the coating C having the first pattern C1 and the second pattern C2, and the second surface of the light-guiding layer 12 is provided with the third pattern C3, as shown in FIG. 2, in combination with the light-emitting module 13 arranging a first light-emitting element 132A, a second light-emitting element 132B, and a third light-emitting element 132C in sequence to form a light-emitting element unit 132, followed by arranging the plurality of light-emitting units 132 linearly on the printed circuit board 131, each light-emitting unit 132 can be controlled to supply current to make the first light-emitting element 132A, the second light-emitting element 132B, or the third light-emitting element 132C emit light.

Although not shown in the figure, it can be understood that when the coating C on the first surface of the light-guiding layer 12 is only provided with the first pattern C1 or only the second pattern C2, the light-emitting module 13 comprises only the plurality of first light-emitting elements 132A and third light-emitting elements 132C, or the plurality of second light-emitting elements 132B and third light-emitting elements 132C, arranged linearly arranged on the printed circuit board 131.

The controller 2 is used to electrically connect the light-adjusting layer 11 and the light-emitting module 13 to control the light-adjusting layer 11 to change between transparent and opaque states, and to control whether each light-emitting element of the light-emitting module 13 to emit light or not.

Figure 8:
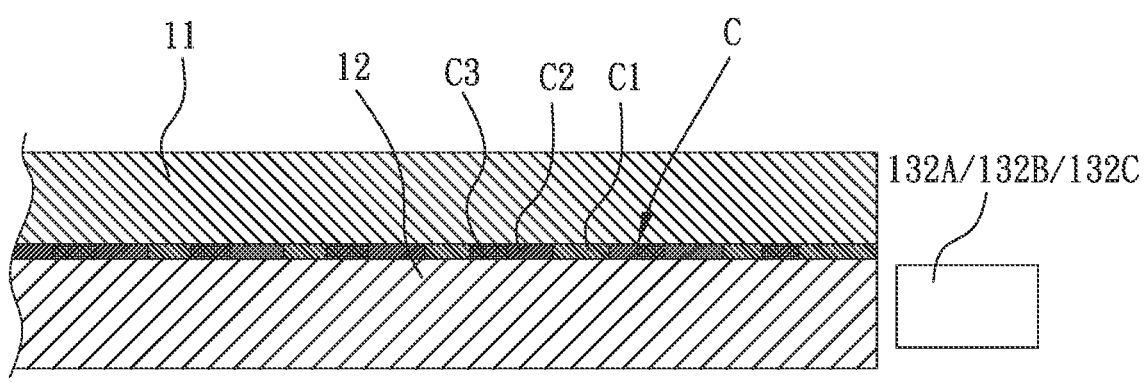
FIG. 8 is a schematic cross-sectional view showing an embodiment of the present invention printing a light-guiding layer with a pattern directly on the light-adjusting layer.

As shown in FIG. 8, in another embodiment of the present invention, the second surface of the light-adjusting layer 11 can be directly printed with a material having light-guiding properties to form the light-guiding layer 12, and at the same time the surface of the light-guiding layer 12 forms the coating C including the first pattern C1, the second pattern C2, and the third pattern C3.

As shown in FIG. 1, the light-emitting apparatus 1 of the invention is pasted and fixed on the surface of the sunroof glass 3 of the automobile through an adhesive layer 14, such as a double-sided foam tape.

As shown in FIGS. 4 to 7, the light-emitting apparatus of the present invention is preferably provided with a coating C comprising a first pattern C1 and a second pattern C2 on the first surface of the light-guiding layer 12, and a third pattern C3 on the second surface, and the light-emitting module 13 is configured with the first light-emitting elements 132A, second light-emitting elements 132B, and third light-emitting elements 132C. The first light-emitting element 132A, the second light-emitting element 132B, and the third light-emitting element 132C can be selectively switched via controller 2. The following describes how to use the present invention:

When the occupant in the car needs to watch the external environment through the sunroof glass 3 from the inside of the car, the light-adjusting layer 11 can be controlled by the controller 2 to become in a transparent state. At this point, the light-emitting module 13 is not powered and does not emit light. The eyes of the occupants in the car can watch the external view outside the car through the light-adjusting layer 11 and the sunroof glass 3. When the light-adjusting layer 11 is controlled by the controller 2 to be in an opaque state, the light-emitting module 13 can be controlled to energize and emit light, so that the light enters the light-guiding layer 12 and conducts to generate a light-emitting pattern. In this state, because the light-adjusting layer 11 is opaque, the outside environment cannot be seen and the interior of the vehicle becomes darker, so the occupants in the vehicle can clearly see the generated luminous pattern.

As shown in FIG. 4, when the circuit is switched to that only the first light-emitting element 132A emits ultraviolet light L1, only the first pattern C1 produces a fluorescent reaction to the ultraviolet light L1 to emit light, and the second pattern C2 produces no fluorescent reaction and no light is emitted. As a result, the luminous first pattern C1 is reflected from the second surface of the light-guiding layer 12, and the occupants in the vehicle can see the first pattern on the sunroof when looking up. At the same time, the ultraviolet light L1 emitted by the first light-emitting element 132A is also reflected and refracted in the recesses 121 of the third pattern C3; therefore, the third pattern C3 emits light and is reflected from the second surface of the light-guiding layer 12.

Figure 5:
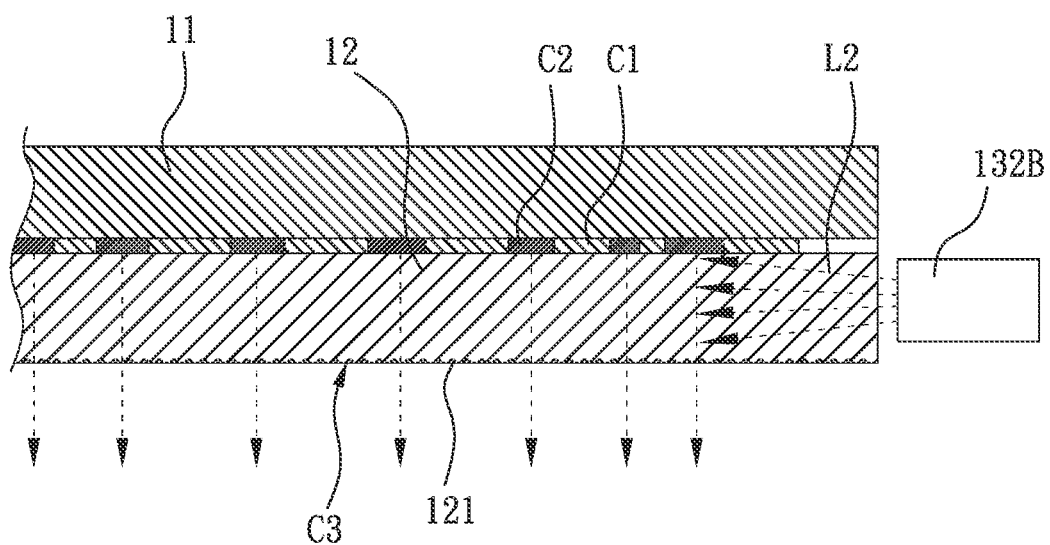
FIG. 5 is a schematic side view showing that the second light-emitting element of the light-emitting apparatus of the present invention emitting infrared light so that the second pattern of the coating produces a fluorescent reaction.

As shown in FIG. 5, when the circuit is switched to that only the second light-emitting element 132B emits infrared light L2, only the second pattern C2 produces a fluorescent reaction to the infrared light L2 to emit light, and the first pattern C1 produces no fluorescent reaction and does not emit light. As a result, the second pattern C2 that emits light reflects off the second surface of the light-guiding layer 12, and the occupants in the car can see the second pattern on the sunroof when looking up. Since the infrared light L2 is invisible light, the third pattern C1 will not emit light when only the second light-emitting element 132B emits the infrared light L2.

Figure 6:
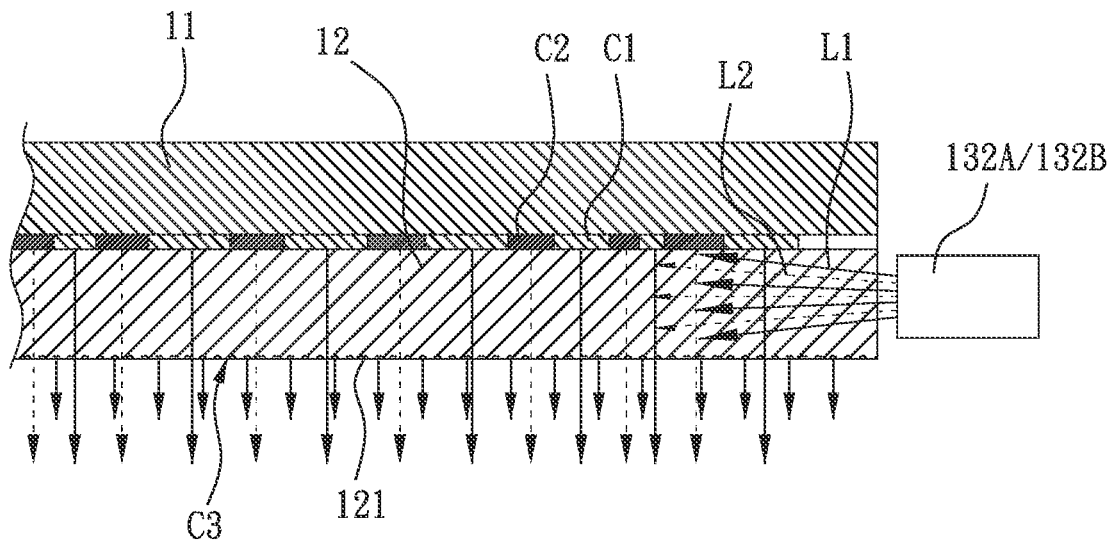
FIG. 6 is a schematic side view showing that the first light-emitting element and the second light-emitting element of the light-emitting apparatus of the present invention emit light at the same time, so that the first pattern and the second pattern simultaneously produce fluorescent reactions.

As shown in FIG. 6, when the circuit is switched to that the first light-emitting element 132A emits ultraviolet light L1 and the second light-emitting element 132B emits infrared light L2, the first pattern C1 produces a fluorescent reaction to the ultraviolet light L1 to emit light, and at the same time, the second pattern C2 produces a fluorescent reaction to the infrared light L2 to emit light, and the ultraviolet light L1 is reflected and refracted by the recess 121 of the third pattern C3 to emit light, so that the first pattern C1, the second pattern C2, and the third pattern C3 appear on the second surface of the light-guiding layer 12 at the same time. A more three-dimensional effect can be achieved through the first pattern C1, the second pattern C2, and the third pattern C3 that are properly designed and matched.

Figure 7:
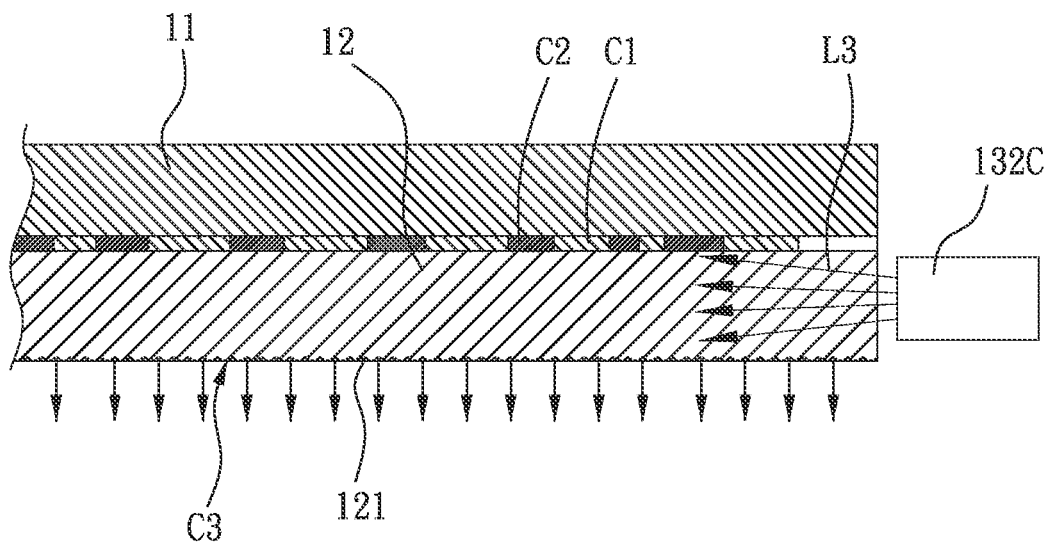
FIG. 7 is a schematic side cross-sectional view showing that the third light-emitting element of the light-emitting apparatus of the present invention emits light to reflect and refract the third pattern.

As shown in FIG. 7, when the circuit is switched to that only the third light-emitting element 132C emits the primary color light L3, only the recess 121 of the third pattern C3 reflects and refracts the primary color light L3 and emits light. Neither the first pattern C1 nor the second pattern C2 produces fluorescent reaction and does not emit light. As a result, only the third pattern C3 appears on the second surface of the light-guiding layer 12, and the occupants in the vehicle can see the third pattern on the sunroof when looking up. The third light-emitting element 132C can also be controlled to emit red, blue or green light separately or simultaneously, so that the third pattern presents more colorful visual effects.

As shown in FIG. 8, in a preferred embodiment of the present invention, a material with light-guiding properties is directly printed on the second surface of the light-adjusting layer 11 to form the light-guiding layer 12 and includes the first pattern C1, the second pattern C2 and the third pattern C3 of the pattern layer C. The first light-emitting element 132A, the second light-emitting element 132B, and/or the third light-emitting element 132C can be controlled to emit light individually or simultaneously by the controller 2, so that the first The pattern C1, the second pattern C2, and the third pattern C3 respond to corresponding light to emit light respectively.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A light-emitting apparatus for automobile sunroof, comprising:
    a light-adjusting layer, formed into a transparent state when energized, and formed into an opaque state when not energized;
    an adhesive layer, disposed on a first surface of the light-adjusting layer, for bonding to the surface of the automobile sunroof;
    a light-guiding layer, disposed on a second surface of the light-adjusting layer, at least one surface of the light-guiding layer being disposed with a patterned layer;
    a light-emitting module, disposed on at least one side of the light-guiding layer to emit light into the light-guiding layer for conduction to produce a luminous effect of the patterned layer; and
    a controller, electrically connecting the light-adjusting layer and the light-emitting module;
    wherein, when the controller controlling a current to flow into the light-adjusting layer to form transparency, the light-emitting module being inactive and not emitting light; when the controller allowing the current to flow into the light-adjusting layer to form opacity, the light-emitting module becoming energized to emit light.

2. The light-emitting apparatus for automobile sunroof according to claim 1, wherein the light-guiding layer is disposed on the light adjusting layer by gluing.

3. The light-emitting apparatus for automobile sunroof according to claim 1, wherein the light-guiding layer is printed on the second surface of the light-adjusting layer with a material having light-guiding properties, and the pattern is formed on the surface of the light-guiding layer.

4. The light-emitting apparatus for automobile sunroof according to claim 1, wherein a coating with a first pattern is provided on the first surface of the light-guiding layer, and the first pattern is formed by a first ink that can produce a fluorescent reaction to ultraviolet light; a third pattern is formed on the second surface of the light-guiding layer opposite to the first surface, and the third pattern comprises a plurality of recesses that can reflect and refract light;
    wherein the light-emitting module comprises a printed circuit board, a plurality of first light-emitting elements, and a plurality of third light-emitting elements arranged on the printed circuit board; the plurality of first light-emitting elements emits ultraviolet light, and the plurality of third light-emitting elements emits primary color light.

5. The light-emitting apparatus for automobile sunroof according to claim 4, wherein the first light-emitting element is an ultraviolet LED, and the third light-emitting element is a primary color LED.

6. The light-emitting apparatus for automobile sunroof according to claim 4, wherein the coating further includes a second pattern, the second pattern is formed by a second ink that can produce a fluorescent reaction to infrared light and does not overlap with the first pattern; and
    a plurality of second light-emitting elements are arranged on the printed circuit board, and the plurality of second light-emitting elements emits infrared light.

7. The light-emitting apparatus for automobile sunroof according to claim 6, wherein the second light-emitting element is an infrared LED.

8. The light-emitting apparatus for automobile sunroof according to claim 4, wherein the third pattern is formed by laser engraving to form the plurality of recesses on the second surface of the light-guiding layer.

* * * * *